(12) United States Patent
Benedix

(10) Patent No.: US 6,483,166 B2
(45) Date of Patent: Nov. 19, 2002

(54) SEMICONDUCTOR CONFIGURATION HAVING AN OPTICAL FUSE

(75) Inventor: Alexander Benedix, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/867,486

(22) Filed: May 30, 2001

(65) Prior Publication Data

US 2002/0003278 A1 Jan. 10, 2002

(30) Foreign Application Priority Data

May 30, 2000 (DE) .......................................... 100 26 926

(51) Int. Cl.⁷ ............................................... H01L 29/00
(52) U.S. Cl. ........................ 257/529; 257/530; 257/209; 438/132; 438/128; 438/129
(58) Field of Search ................................ 257/529, 530, 257/50, 209, 81, 99, 103, 728, 729; 438/128, 129, 132, 215, 281, 333, 467, 601

(56) References Cited

U.S. PATENT DOCUMENTS

| | | | |
|---|---|---|---|
| 6,033,939 A | | 3/2000 | Agarwala et al. |
| 6,232,210 B1 | * | 5/2001 | Lee et al. .................... 257/529 |
| 6,259,147 B1 | * | 7/2001 | Iwamoto et al. ............ 257/529 |
| 6,288,436 B1 | * | 9/2001 | Narayan et al. ............. 257/529 |
| 6,323,534 B1 | * | 11/2001 | Marr et al. ................... 257/529 |

FOREIGN PATENT DOCUMENTS

| | | |
|---|---|---|
| EP | 1037278 A2 | 9/2000 |
| JP | 409146056 * | 6/1997 |

* cited by examiner

*Primary Examiner*—David Nelms
*Assistant Examiner*—Andy Huynh
(74) *Attorney, Agent, or Firm*—Laurence A. Greenberg; Werner H. Stemer; Ralph E. Locher

(57) ABSTRACT

The semiconductor configuration has a packing material that is permeable to radiation energy in a given wavelength band. One or more fuses that adjoin the packing material absorb the energy in the given wavelength band. The fuses are formed of $A_{III}B_V$ semiconductor material, of titanium silicide, germanium, PbS, InSb, or of SiGe.

7 Claims, 1 Drawing Sheet

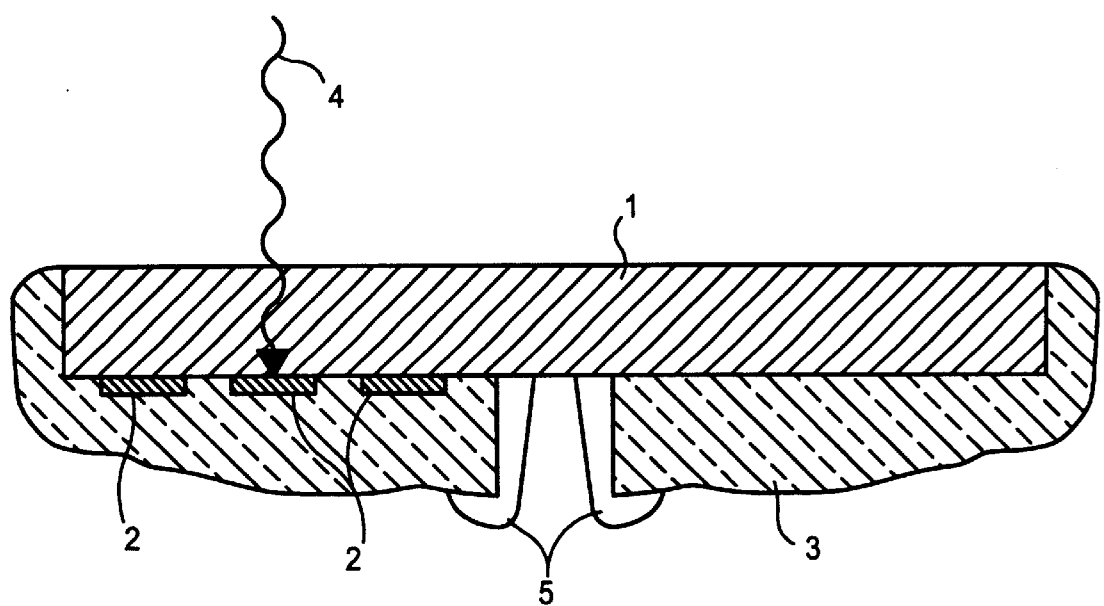

SEMICONDUCTOR CONFIGURATION HAVING AN OPTICAL FUSE

BACKGROUND OF THE INVENTION

Field of the Invention

The invention lies in the semiconductor technology field. More specifically, the present invention relates to a semiconductor configuration having an optical fuse (fuse link), which is composed of a material that can absorb radiation energy in at least one specific wavelength band, and having a packing material at least partially adjoined by the optical fuse.

Recently, optically programmable fuses have been used, inter alia, preferably in semiconductor memory configurations. There they are used, for example, to activate redundant elements during a wafer test. Such a wafer test is used, for example, to determine faulty memory cells and to replace them by redundant memory cells, by blowing fuses and/or antifuses.

Once semiconductor configurations have left the "wafer level" and, in order to remain with the example of semiconductor memory configurations, are packed in packs as memory modules, it is currently impossible to repair faulty or weak memory cells at the module level, or to replace them by redundant memory cells, by blowing fuses.

For this reason, modules which indicate faults in a final test at the module level (backend test), such as drift after burn-in (load test), are rejected. In other words, at the moment, it is impossible to use optical fuses to repair semiconductor configurations at the module level.

SUMMARY OF THE INVENTION

It is accordingly an object of the invention to provide a semiconductor configuration with an optical fuse, which overcomes the above-mentioned disadvantages of the heretofore-known devices and methods of this general type and which allows repairs at the module level by blowing the fuse.

With the foregoing and other objects in view there is provided, in accordance with the invention, a semiconductor configuration, comprising:

an optical fuse composed of a material selected from the group consisting of an $A_{III}B_V$ semiconductor material, titanium silicide, germanium, PbS, InSb, and SiGe and configured to absorb radiation energy in a given wavelength band; and a packing material adjoining the optical fuse and being permeable to the radiation energy in the given wavelength band.

In accordance with an added feature of the invention, the optical fuse is partially adjacent the packing material.

In other words, the radiation energy can at least partially pass through the packing material in the specific wavelength band. In this context, the term packing material means, in an entirely general form and for example, also the semiconductor body or the substrate, or a carrier for the semiconductor configuration.

The fuse in the semiconductor configuration according to the invention absorbs radiation energy in a different wavelength band to that of the packing material of the semiconductor configuration.

In accordance with an additional feature of the invention, the packing material is silicon and the $A_{III}B_V$ semiconductor material is InGaAsP.

For example, in the case of Rambus CSP (Rambus=DRAM architecture, such as SDRAM; CSP=Chip Size Package), the rear face of the pack (or package) consists of the bare silicon of the chip which contains the semiconductor configuration. A material is then chosen for the fuses which are arranged on the front face of the chip, which absorbs radiation energy in a band to which the pack material is transparent, that is to say silicon in the present example. So-called III-V material, or $A_{III}B_V$ semiconductor materials are suitable, for example, for use as this material. InGaAsP is particularly advantageous as the fuse material if the packing material is formed by the chip of the semiconductor configuration. Other materials are also suitable for the fuses, such as metals, standard alloys, other alloys, germanium, PbS, InSb, SiGe etc. Examples include standard metallizations for integrated circuits based on tungsten or aluminum, copper and titanium silicide.

Silicon has a radiation energy absorption coefficient which decreases sharply at wavelengths above about 950 nm and is virtually transparent in the wavelength band above 1050 nm. If a laser with a wavelength of about 1350 nm is used for the radiation energy, then the laser radiation passes through the silicon of the chip virtually without any impediment. Radiation in the 1350 nm wavelength band is, however, absorbed to an excellent extent by all the $A_{III}B_V$ semiconductor materials, so that fuses composed of these $A_{III}B_V$ semiconductor materials can be blown by the inference of laser radiation.

The invention thus makes it possible to repair semiconductor configurations at module level in a final test, after they have been packed, by blowing fuses, if faults are found in a final test. This is achieved by using materials through which radiation energy can pass for the packing of the module, that is to say for the semiconductor configuration pack, while the fuses which are used for the repair are composed of materials which absorb all the radiation energy which is passed through the packing.

The invention can advantageously be applied to semiconductor memory configurations. However, the invention can, of course, also be used expediently with other semiconductor configurations in which redundant components are switched on by blowing a fuse, in order to replace faulty components as required.

In the semiconductor configuration according to the invention, the fuse must be provided such that it is at least partially accessible through the packing material for the radiation energy which acts from the exterior on the semiconductor configuration. This can be achieved by providing the fuse on the top face of a semiconductor chip whose silicon body itself forms the packing.

However, the present invention can, of course, also be applied to other forms of the packing; the only critical feature is that radiation energy which is absorbed by the fuse can pass through the packing, and that the radiation energy can act on the fuse via the packing.

It should also be mentioned that the term "packing" means a housing in the general sense which protects the semiconductor configuration, that is to say the integrated circuit contained in it. In the above example, the packing is formed by the chip itself.

The packing can also be soldered on a module as, for example, in the case of an RIMM (Rambus Inline Memory Module). The only critical feature is that the fuses remain accessible through the packing for radiation energy, and that they can absorb this radiation energy.

Other features which are considered as characteristic for the invention are set forth in the appended claims.

Although the invention is illustrated and described herein as embodied in semiconductor configuration with an optical fuse, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE is a partial sectional view illustrating a semiconductor configuration.

DETAILED DESCRIPTION OF THE PREFERRED EMBODIMENT

Referring now to the sole FIGURE of the drawing in detail, there is shown a semiconductor body 1 composed of silicon which contains a semiconductor memory configuration on its top face (at the bottom in the FIGURE). A semiconductor memory configuration such as this may be, for example, a DRAM or an SDRAM.

Furthermore, fuses 2 are also provided on that face of the semiconductor body 1 which has the semiconductor memory configuration. These fuses 2 are composed of InGaAsP. The fuses and that face of the semiconductor body 1 which has the semiconductor memory configuration are embedded in a chip pack 3 which is composed of a suitable dielectric material, for example epoxy resin. Bonding wires 5 may project out of this epoxy resin and may be used for external connections.

As mentioned above, the silicon of the semiconductor body 1 is virtually transparent for radiation energy in the wavelength band above about 1050 nm. Accordingly, a laser beam 4 at a wavelength of about 1350 nm can pass through the silicon of the semiconductor body 1 with virtually no interference, and can thus reach the fuses 2 from the rear face of the semiconductor body 1. However, since the fuses 2 are composed of InGaAsP which absorbs radiation energy at 1350 nm, they can be blown by the laser beam 4.

Materials other than the silicon of the semiconductor body 1 may, of course, also be used for the packing. The same is also true of the fuses: these may be composed of $A_{III}B_V$ (III-V) semiconductor materials other than InGaksP. Apart from $A_{III}B_V$ semiconductor materials, other materials may also be used for the fuses 2 provided they absorb radiation energy which has passed through the packing material.

I claim:

1. A semiconductor configuration, comprising:

an optical fuse composed of a material selected from the group consisting of an $A_{III}B_V$ semiconductor material, titanium silicide, germanium, PbS, InSb, and SiGe and configured to absorb radiation energy in a given wavelength band; and a packing material adjoining said optical fuse and being permeable to the radiation energy in the given wavelength band.

2. The semiconductor configuration according to claim 1, wherein said optical fuse is partially adjacent said packing material.

3. The semiconductor configuration according to claim 1, wherein said packing material forms a semiconductor body of the semiconductor configuration.

4. The semiconductor configuration according to claim 1, wherein said packing material forms a carrier of the semiconductor configuration.

5. The semiconductor configuration according to claim 1, wherein said packing material forms a substrate of the semiconductor configuration.

6. The semiconductor configuration according to claim 3, wherein said packing material is silicon.

7. The semiconductor configuration according to claim 1, wherein said $A_{III}B_V$ semiconductor material is InGaAsP.

* * * * *